United States Patent [19]

Layton

[11] 4,227,037

[45] Oct. 7, 1980

[54] SHIELDED NON-METALLIC CONTAINER

[75] Inventor: Paul L. Layton, Irvine, Calif.

[73] Assignee: Gulf & Western Manufacturing Company, Southfield, Mich.

[21] Appl. No.: 43,206

[22] Filed: May 29, 1979

[51] Int. Cl.³ .............................................. H05K 9/00
[52] U.S. Cl. .............................. 174/35 MS; 264/105; 336/84 C; 361/424
[58] Field of Search .................. 174/35 R, 35 MS, 50; 361/424; 264/104, 105; 220/72, DIG. 11, DIG. 12, DIG. 21; 336/84 C; 219/10.55 D

[56] References Cited

U.S. PATENT DOCUMENTS

| 3,376,531 | 4/1968 | Fischer et al. | 174/35 MS X |
| 3,436,467 | 4/1969 | Smith | 174/35 MS |
| 3,487,186 | 12/1969 | Johnson et al. | 174/35 MS X |

Primary Examiner—B. A. Reynolds
Assistant Examiner—D. A. Tone
Attorney, Agent, or Firm—Gregory J. Battersby; Thomas E. Harrison, Jr.

[57] ABSTRACT

A shielded, non-metallic container is provided including complementary upper and lower portions adapted to mate and engage in order to define an enclosed chamber. The upper and lower portions are laminated with a non-metallic, electrically conductive inner layer integrally molded to and bonded between at least two outer non-metallic reinforcing layers. This construction permits shielding of the chamber from electromagnetic and radio frequency interference. A method for manufacturing the container is further provided.

8 Claims, 7 Drawing Figures

SHIELDED NON-METALLIC CONTAINER

BACKGROUND OF THE INVENTION

The present invention relates generally to the manufacture of a shielded, non-metallic container and, more specifically, to such a container which provides uniform and continuous shielding from electromagnetic interference and radio frequency interference.

With the increased reliance on and use of electronic instrumentation on aircraft, there has become a need to provide containers for such instrumentation which are highly sensitive to the interference generated by the myriad of electronic equipment which is present in an aircraft cockpit. Certain electronic instrumentation, particularly guidance and control instruments, are very sensitive to the electromagnetic interference (EMI) and the radio frequency interference (RFI) produced by conventional electronics and, thus, to be effective must be shielded. To this effect, EMI and RFI sensitive instruments are stored in shielded containers to block out any such interference and permit them to operate effectively.

Such containers for electronic instrumentation preferably are fabricated from materials having a high strength per weight ratio and a high impact strength. Additionally, the entire case must be uniformly electrically conductive in order to shield its contents over the entire electronic frequency spectrum. Further, the container should be resistant to temperatures in excess of about 450° F. yet be capable of permitting the transfer of heat from the container.

Heretofore, different types of shielded containers have commonly been employed. One such container is a completely metallic container which is not only expensive, but is generally quite heavy and does not permit the transfer of heat from the container. Another type is an otherwise unshielded thermoplastic case having on the inner surface a silver coating which is sprayed using a spray gun. The inherent disadvantages of such a container is that not only is it quite costly due to the price of silver but uniform electrical conductivity is never achieved due to an inability to achieve a uniform distribution of the silver particles over the entire surface of the container.

Another approach to producing such a container utilizes a wire mesh which is molded into an otherwise unshielded non-metallic container. Such containers also present difficulties in effectively shielding the inner chamber due to a tendency of the wire mesh to break when molded around corners, thus breaking the electrical conductivity.

Other attempts have included the use of non-metallic containers using a powdered carbon as a conductive material but, attempts with such conductive materials also have proven unsuccessful due to an inability to obtain uniform conductivity.

Against the foregoing background, it is a primary objective of the present invention to provide a non-metallic container which is effective in uniformly shielding its contents from electromagnetic and radio frequency interference.

It is another objective of the present invention to provide such a non-metallic container which is lightweight, has a high impact strength, a high modulus of elasticity, is resistant to temperatures of at least about 450° F. and is capable of permitting the transfer of heat from its chamber.

It is still another objective of the present invention to provide such a container which has a substantially uniform electrical conductivity over its entire surface.

It is yet still another objective of the present invention to provide a method for manufacturing the container of the present invention.

SUMMARY OF THE INVENTION

To the accomplishments of the foregoing objects and advantages, the present invention, in brief summary, comprises a shielded, non-metallic container having complementary, laminated upper and lower portions adapted to mate and engage to define an enclosed chamber. The upper and lower portions are each laminated with an inner, electrically conductive layer of a high strength, high modulus, long fiber carbon mat integrally molded and bonded to and between at least two outer reinforcing layers of chopped strand fiberglass mat using a thermosetting polyester resin. The inner, electrically conductive layer serves to shield the chamber from electromagnetic and radio frequency interference.

A preferred method of manufacturing the portions of the container is further provided wherein at least one reinforcing mat, the long fiber carbon mat and a second reinforcing mat are introduced into a heated mold. The polyester resin is then added in an amount sufficient to produce about a 60% inorganic content in the molded container. Molding is effected by the applicaton of about 70 psi of pressure from a plunger.

BRIEF DESCRIPTION OF THE DRAWINGS

The foregoing and still other objects and advantages of the present invention will be more apparent from the following detailed explanation of the invention in connecton with the accompanying drawings wherein.

DETAILED DESCRIPTION OF THE PREFERRED EMBODIMENTS

Figure 1:
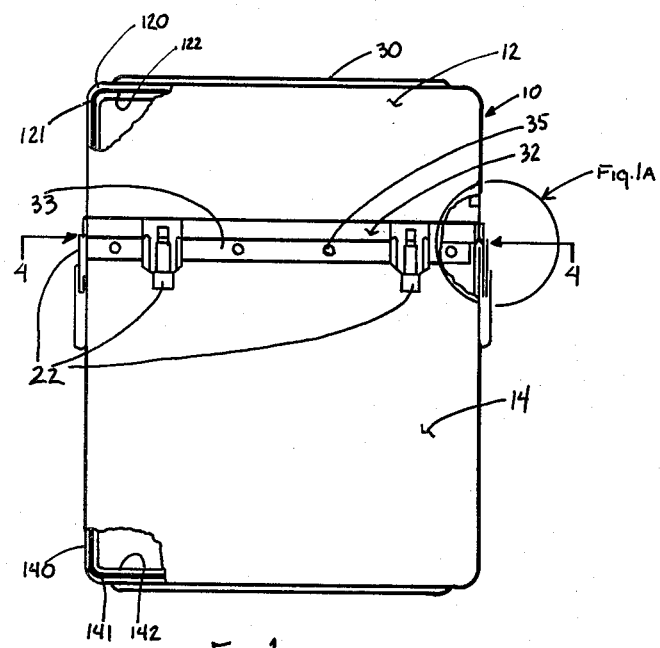
FIG. 1 is a front plan view of the container of the present invention.

Referring now to the drawings and, in particular, to FIG. 1 thereof, there is shown, in front plan view, the container of the present invention identified generally by reference numeral 10. Container 10, which is of conventional generally rectangular configuration, includes upper and lower portions 12 and 14 which are secured to one another by a plurality of conventional fastening clamps 22, preferably six in number. Upper and lower portions 12 and 14 may also be hinged together by conventional hinges (not shown).

Figure 3:
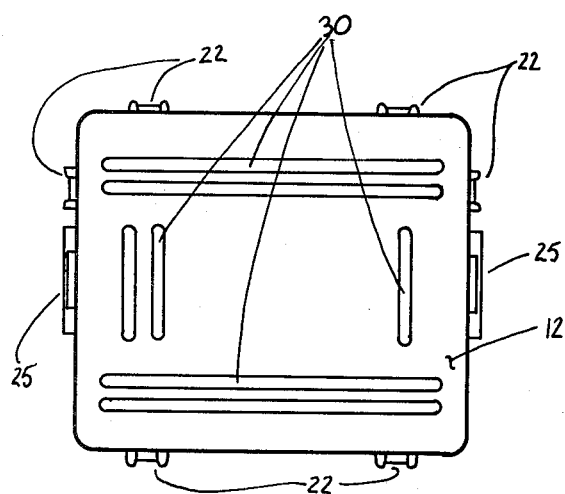
FIG. 3 is a top view thereof.
Figure 4:
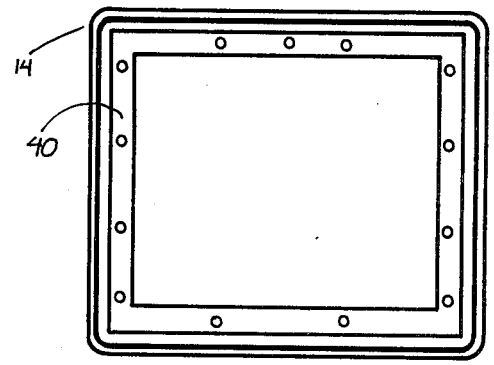
FIG. 4 is a sectional view taken along line 4—4 of FIG. 1.
Figure 2:
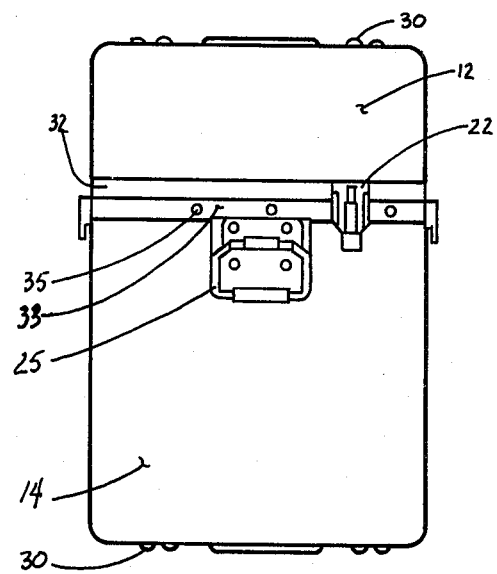
FIG. 2 is a side view thereof.

As shown in FIGS. 1 and 2, conventional gripping handles 25 are also provided on opposite sides of the container 10 to permit the container 10 to be easily transported. A plurality of ribs 30, perpendicularly situated, are provided on the top and bottom surfaces of the upper and lower portions, 12 and 14, respectively, as shown in FIGS. 2 and 3. Ribs 30 are provided to create a raised surface for the container when resting on the floor.

Figure 1A:
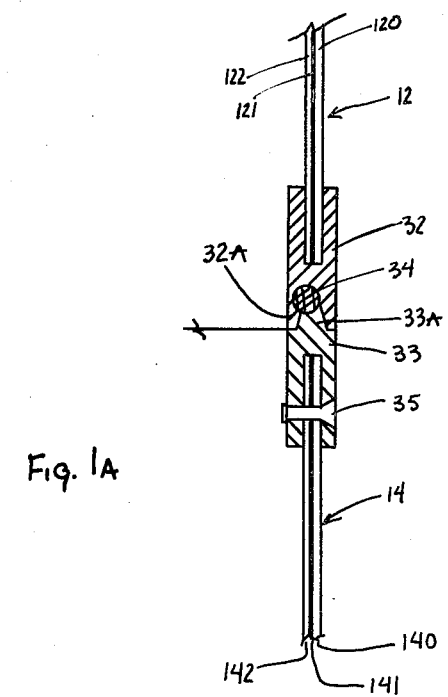
FIG. 1A is an enlarged sectional view of the circled portion of FIG. 1.

As shown in the enlarged sectional view of FIG. 1A, the upper and lower portions 12 and 14 include upper and lower closures 32 and 33 respectively, to secure the portions 12 and 14 together. Each of the closures 32 and 33, which may be metallic or non-metallic, are slotted and adapted to receive within the slots the edges of the upper and lower portions 12 and 14 of the container 10. In order to provide a substantially uniformly shielded container, the edges 32A and 33A of the closures 32 and 33 are adapted to provide an engaging female and male joint between which an electromagnetic and radio frequency interference resistant gasket 34 is provided to insure a tight mating. The edge of lower portion 14 is secured within the slot of closure 33 by a number of rivets 35, while the edge of non-metallic upper portion 12 is secured within the slot of closure 32 by simple compression or by the use of an adhesive.

The non-metallic upper and lower portions 12 and 14 of container 10 are laminates as shown in the cutaway portions of FIG. 1 and in FIG. 1A and, specifically, laminates having an inner layer 121 and 141 of a mat of conductive high strength, high modulus, long fiber carbon filaments in random layered orientation 121 and 141 for the upper and lower portions, respectively, and two outer layers each of resin-set reinforcing material 120 and 122 for the upper portion 20, and 140 and 142 for the lower portion 40.

The outer reinforcing material 120, 122, 140 and 142 may be virtually any suitable reinforcing material, preferably selected from the group consisting of mats of chopped strand fiberglass, continuous strand fiberglass, nylon and aramid fibers. Chopped strand fiberglass is a preferred reinforcing material wherein the length of industrial fiberglass fibers is between about $\frac{1}{4}$" and about 2". A particularly suitable chopped strand fiberglass mat is obtainable from Owens Corning Fiberglass of Toledo, Ohio, under the trademark Fiberglas.

The resins in which the carbon mat and the reinforcing materials are set may be conventional thermosetting and thermoplastic cementitous materials. Preferred thermosetting resins are selected from the group consisting of polyester resins, epoxys, silicones and phenolic resins. Preferred thermoplastic resins are selected from the group consisting of vinyl esters, urethanes, acrylics, polycarbonates and ABS copolymers. A particularly preferred resin is a thermoset polyester resin which meets all of the requirements of military specification MIL-R-7575C dated June 29, 1966, and entitled Resin, Polyester, Low Pressure Laminating. Such a particularly preferred polyester resin is marketed by the Koppers Company, Pittsburgh, Pa., under the trademark Dion.

In a preferred embodiment, the upper and lower portions 12 and 14 of container 100 are laminates, the outer layers of which are formed from chopped strand fiberglass mat; the middle layer from a mat of high strength, high modulus, electrically conductive long fiber carbon filaments randomly oriented in layers, all bonded using a thermosetting polyester resin. In such an embodiment, after molding, all of the individual layers are of substantially uniform thickness, i.e., between about 0.1 and 0.2 inches in thickness.

Figure 6:
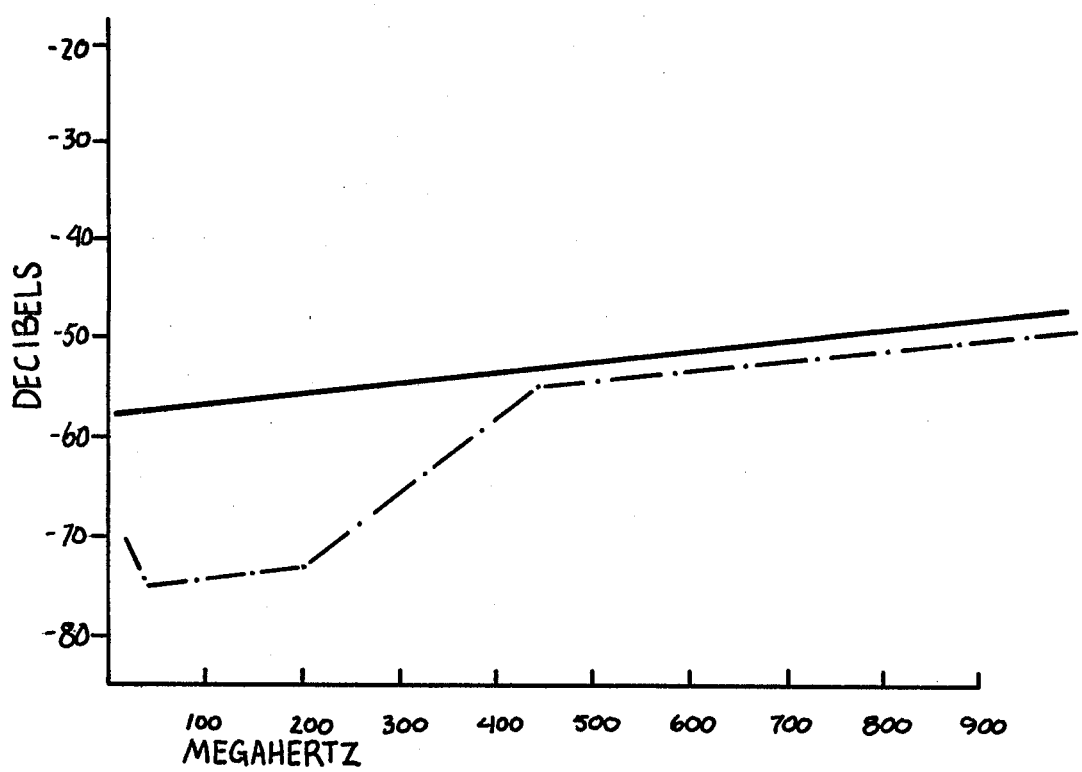
FIG. 6 is a graph illustrating the EMI/RFI resistance of the container of the present invention against $\frac{1}{8}''$ aluminum sheet material.

The shielded, non-metallic container 10 of the present invention, due to the inclusion of the inner layer of electrically conductive, long fiber, carbon mat, offers a container which is as durable, heat resistant and lightweight as other non-shielded containers presently available, yet effective shielding of its contents from electromagnetic and radio frequency interference. Specifically, the container 10 of the present invention offers a flexural strength greater than about 55,000 psi; a flexural modulus in excess of about $2 \times 10^6$ psi; and a tensile strength greater than 30,000 psi. Flexural strength and flexural modulus of this magnitude offer a high strength but resilient container which is superior to aluminum or other metallic cases, since the container, under stress, will yield but not crack. The container 10 is also resistant to temperatures of at least about 450° F. These properties compare favorably to presently available non-shielded, non-metallic containers but offer effective shieldng from electromagnetic and radio frequency interference. The relative EMI/RFI resistance of the laminate of container 10 compared to the resistance of $\frac{1}{8}$" aluminum sheet commonly used in manufacturing such cases, is shown graphically in FIG. 6. As illustrated in FIG. 6, the shielding ability of the laminated container 10 of the present invention is superior to $\frac{1}{8}$" aluminum sheet at frequencies of up to about 500 MHZ and is at least equal to $\frac{1}{8}$" aluminum sheet at higher frequencies.

Another advantage offered by the container 10 of the present invention is that, due to the use of long fiber carbon mat, it permits rapid dissipation of heat within the case, a significant property when heat emitting yet heat sensitive electronics are stored within the container. The thermal conductivity of individual long fiber carbon fibers is $4.6 \times 10^{-2}$ cal/sec CM° C. compared to the thermal conductivity of fiberglass fibers which is $2.0 \times 10^3$ cal/sec CM° C.

Figure 5:
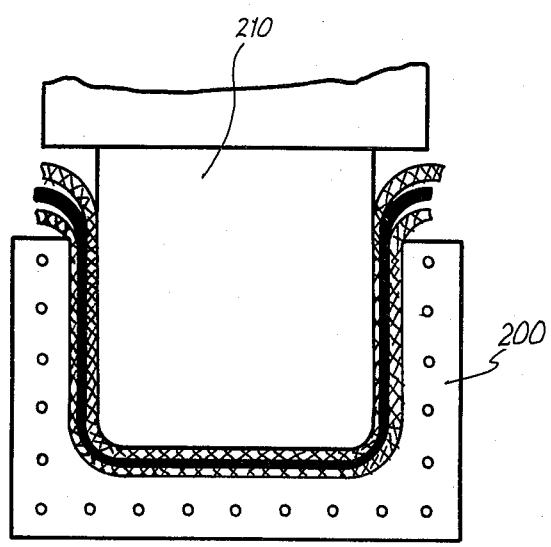
FIG. 5 is a front plan view schematically illustrating a preferred thermosetting method for manufacturing the container of the present invention.

The upper and lower portions 12 and 14 of the container 10 of the present invention may be manufactured in a variety of ways including the method illustrated in FIG. 5 wherein the casing is formed in a conventional temperature-controlled mold 200. When a thermosetting resin is used, the mold is preheated and maintained at a temperature of between about 200° F. and 300° F. When a thermoplastic resin is used, no preheating is necessary. The mold 200 is then loaded with a pre-cut mat of the reinforcing material, a pre-cut mat of long fiber carbon filaments and a second mat of reinforcing material. The thermoplastic or thermosetting resin, in an amount sufficient to yield between a 50% and 60% inorganic content in the molded container, is then poured into the mold over the mats of reinforcing material and carbon filaments and the portions 12 and 14 of the container 10 are then molded with pressure applied by plunger 210 for a period of time up to about 10 minutes. The portions 12 and 14 of the molded container 10 are then demolded and trimmed. Plunger 210 is adapted to apply a sufficient amount of pressure to effect molding, preferably between about 60 and about 75 psi.

In a preferred embodiment, the upper and lower portions 12 and 14 of container 10 are molded in the following manner: two pre-cut 2 ounce mats of chopped strand fiberglass, each approximately 0.125 inches in thickness, are introduced into mold 200 which has been pre-heated to a temperature of between about 225° F. and about 250° F. A pre-cut mat of high strength, high modulus, electrically conductive, long fiber carbon filaments approximately 0.5 inches thick, is then introduced into the mold 200 followed by two additional pre-cut 2 ounce mats of chopped strand fiberglass. It has been found that the use of two 2 ounce fiberglass mats instead of one 4 ounce mat is preferred due to the curvature of the container. A thermosetting polyester resin is then added to mold 200 in an amount sufficient to yield approximately a 60% inorganic content in the molded product. Molding is effected by the introduction of approximately 70 psi of pressure from plunger 210 for about 9 minutes, followed by demolding and trimming operations.

The following example serves to illustrate the present invention and should not be construed as limiting the scope of the invention.

EXAMPLE

In order to more clearly illustrate the preparation of the shielded container of the present invention and its properties, two containers were thermoset molded, one of which was a laminate of chopped strand fiberglass mat/long fiber carbon mat/chopped strand fiberglass mat using a thermosetting polyester resin molded in accordance with the teachings of the preferred method. The second container was molded in an identical manner without any middle carbon mat. The containers, when tested, had the following properties:

|  | Container 1 (including carbon) | Container 2 (without carbon) |
| --- | --- | --- |
| Flexure Strength (psi) | 56,300 | 51,275 |
| Flexure Modulus (psi × $10^6$) | 2.3 | 1.88 |
| Tensile Strength (psi) | 34,000 | 32,500 |
| Compressive Strength (psi) | 31,100 | 30,584 |
| Density (lbs/in$^3$) | 0.049 | 0.061 |

The properties of the container having the long fiber carbon filament mat were clearly superior to that of the non-carbon container.

The foregoing example is for illustrative purposes only and the invention is not to be limited except as set forth in the following claims.

What is claimed is:

1. A container including complementary upper and lower portions, each portion adapted to mate with and engage to define an enclosed inner chamber, said upper and lower portions each having laminated outer casings wherein a non-metallic, electrically conductive, inner layer is integrally molded with and bonded to and between at least two outer non-metallic reinforcing layers to shield said inner chamber from electromagnetic and radio frequency interference.

2. The container of claim 1 wherein said non-metallic, electrically conductive inner layer is a high strength, high modulus long fiber carbon filament mat.

3. The container of claim 2 wherein said carbon fibers are greater than one inch in length.

4. The container of claim 1 wherein said non-metallic reinforcing layers are selected from the group consisting of chopped strand fiberglass, continuous strand fiberglass and aramid fiber mats.

5. The container of claim 1 wherein said layers are molded together using thermosetting resins selected from the group consisting of polyesters, epoxys, silicones and phenolics.

6. The container of claim 1 wherein said layers are molded together using thermoplastic resins selected from the group consisting of vinyl esters, urethanes, acrylics, polycarbonates and ABS copolymers.

7. A container including complementary upper and lower portions adapted to mate and engage to define an enclosed inner chamber, said upper and lower portions each having laminated outer casings wherein a non-metallic, electrically conductive, inner layer of a high strength, high modulus, long fiber, carbon filament mat is integrally molded with and bonded to and between at least two outer, reinforcing layers of chopped strand fiberglass mat with a thermosetting polyester resin, said inner, electrically conductive layer adapted to shield said inner chamber from electromagnetic and radio frequency interference.

8. The container of claim 7 wherein said carbon fibers are greater than about one inch in length.

* * * * *